(12) United States Patent
Son et al.

(10) Patent No.: US 8,487,531 B2
(45) Date of Patent: Jul. 16, 2013

(54) ENCAPSULATION SHEET, FLAT PANEL DISPLAY DEVICE USING THE SAME, AND METHOD OF MANUFACTURING THE FLAT PANEL DISPLAY DEVICE

(75) Inventors: Jung-Hyun Son, Yongin (KR); Hoon Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/244,168

(22) Filed: Sep. 23, 2011

(65) Prior Publication Data

US 2012/0161619 A1 Jun. 28, 2012

(30) Foreign Application Priority Data

Dec. 24, 2010 (KR) .......................... 10-2010-0134881

(51) Int. Cl.
*H01J 1/62* (2006.01)
(52) U.S. Cl.
USPC .......................................... 313/506; 313/498
(58) Field of Classification Search
USPC .................. 313/498, 506, 512, 552
See application file for complete search history.

(56) References Cited

U.S. PATENT DOCUMENTS

| | | |
|---|---|---|
| 2004/0104673 A1 | 6/2004 | Hosokawa et al. |
| 2007/0096631 A1 | 5/2007 | Sung et al. |
| 2007/0152212 A1 | 7/2007 | Cho et al. |
| 2010/0300746 A1* | 12/2010 | Mackenzie et al. ........... 174/525 |

FOREIGN PATENT DOCUMENTS

| | | |
|---|---|---|
| JP | 2003-168555 A | 6/2003 |
| KR | 1020070047406 A | 5/2007 |
| KR | 10-2007-0072400 A | 7/2007 |
| KR | 10-2007-0101635 | 10/2007 |
| KR | 10-2010-0066431 | 6/2010 |
| KR | 1020100072463 A | 7/2010 |
| WO | WO 2009/031498 A1 | 12/2009 |
| WO | WO 2009/031498 A1 | 12/2009 |

OTHER PUBLICATIONS

Official Action issued by the Korean Industrial Patent Office dated Feb. 10, 2012 in Korean Patent Application, 4 pages.
Official Action issued by the Korean Industrial Patent Office dated Feb. 10, 2012 in Korean Patent Application No. KR 10-2010-0134881, 4 pages.

* cited by examiner

*Primary Examiner* — Vip Patel
(74) *Attorney, Agent, or Firm* — Knobbe Martens Olson & Bear LLP

(57) ABSTRACT

An encapsulation sheet, a flat panel display device, and a method of manufacturing a flat panel display device are disclosed. The method includes: forming a getter on a first sheet; forming a sealant having a space corresponding to the shape of the getter on a second sheet; forming an encapsulation sheet by folding the first sheet and the second sheet to enter the getter into the space; and attaching the encapsulation sheet on a substrate on which a display unit is formed. When the flat panel display device is manufactured using the above method, the folded sealant and the getter are simultaneously mounted on the substrate, and thus, a complicated conventional process of mounting the getter in a vacuum state is unnecessary.

19 Claims, 5 Drawing Sheets

ENCAPSULATION SHEET, FLAT PANEL DISPLAY DEVICE USING THE SAME, AND METHOD OF MANUFACTURING THE FLAT PANEL DISPLAY DEVICE

CROSS-REFERENCE TO RELATED APPLICATION

This application claims the benefit of Korean Patent Application No. 10-2010-0134881, filed on Dec. 24, 2010, in the Korean Intellectual Property Office, the disclosure of which is incorporated herein in its entirety by reference.

BACKGROUND

1. Field

The present embodiments relate to an encapsulation sheet, a flat panel display device, and a method of manufacturing the flat panel display device, and more particularly, to an encapsulation sheet in which the method of mounting a getter for absorbing moisture is improved, a flat panel display device having the encapsulation sheet, and a method of manufacturing the flat panel display device.

2. Description of the Related Technology

Many studies have been conducted to form thin flexible flat panel display devices such as organic light-emitting display apparatuses due to their driving characteristics.

However, a display unit of an organic light-emitting display apparatus is degraded by moisture penetration. Accordingly, the degradation of the display unit by moisture penetration is prevented by mounting a getter in the flat panel display device.

So far, in order to mount the getter a getter paste is coated around the display unit by dispensing or screen printing in a vacuum.

However, this method is complicated and time consuming. Also, due to outgassing of a binder, which is added to the getter paste for coating, the display unit may be contaminated.

Therefore, there is a need to develop a simple and safe method of mounting a getter.

SUMMARY

To address the above and/or other problems, the present embodiments provide an encapsulation sheet in which a getter for absorbing moisture can be simply and safely mounted, a flat panel display device, and a method of manufacturing the flat panel display device.

According to an aspect of the present embodiments, there is provided a method of manufacturing a flat panel display device, the method including: forming a getter on a first sheet; forming a sealant having a space corresponding to the shape of the getter on a second sheet; forming an encapsulation sheet by folding the first sheet and the second sheet so the getter enters into the space; and attaching the encapsulation sheet on a substrate on which a display unit is formed.

The attaching of the encapsulation sheet on the substrate may include: removing one of the first sheet and the second sheet of the encapsulation sheet; attaching the surface of the encapsulation sheet, from which one of the first sheet and the second sheet is removed, to the substrate; and removing the remaining one of the first sheet and the second sheet of the encapsulation sheet.

The method may further include forming a sealing substrate on the encapsulation sheet.

The getter may have a closed loop shape that surrounds the display unit.

The sealant may include a first sealant portion formed in the center region of the second sheet that corresponds to the display unit, and a second sealant portion disposed in an edge region of the second sheet that corresponds to an edge region of the display unit, wherein the space is located between the first and second sealant portions.

According to an aspect of the present embodiments, there is provided an encapsulation sheet including a first sheet on which a getter is formed, and a second sheet on which a sealant having a space corresponding to the shape of the getter is formed, wherein the first sheet and the second sheet are folded so that the getter enters into the space.

The getter may have a closed loop shape.

The sealant may include a first sealant portion formed in the center region of the second sheet, and a second sealant portion formed on an edge region of the second sheet, wherein the space is located between the first and second sealant portions.

According to an aspect of the present embodiments, there is provided a flat panel display device including: a substrate; a display unit formed on the substrate; an encapsulation sheet that covers the display unit; and a sealing substrate formed on the encapsulation sheet, wherein the encapsulation sheet may include: a getter that surround the display unit to absorb moisture; and a sealant that fills a space between the substrate and the encapsulation sheet together with the getter for absorbing moisture.

The getter may have a closed loop shape that surrounds the display unit.

The sealant may include a first sealant portion formed in the center region of the second sheet that corresponds to the display unit, and a second sealant portion formed in an edge region of the second sheet that corresponds to an edge region of the display unit, wherein the space is located between the first and second sealant portions.

BRIEF DESCRIPTION OF THE DRAWINGS

The above and other features and advantages of the present embodiments will become more apparent by describing in detail example embodiments thereof with reference to the attached drawings in which.

DETAILED DESCRIPTION

The present embodiments will now be described more fully with reference to the accompanying drawings in which example embodiments are shown.

Figure 1:
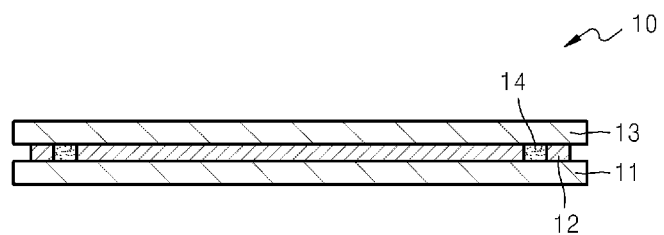
FIG. 1 is a cross-sectional view of an encapsulation sheet according to an embodiment.

FIG. 1 is a cross-sectional view of an encapsulation sheet 10 according to an embodiment.

The encapsulation sheet 10 according to the present embodiment has a structure in which a first sheet 13 having a getter 14 formed thereon and a second sheet 11 having a sealant 12 formed thereon are coupled. After forming the getter 14 on the first sheet 13 and forming the sealant 12 on the second sheet 11 to leave a space 12a (refer to FIG. 3A) into which the getter 14 can enter, the encapsulation sheet 10 is manufactured by combining them. In this way, the encapsulation sheet 10 capable of having the sealant 12 and the getter 14 simultaneously formed on a substrate 20 of the flat panel display may be embodied.

A method of manufacturing the encapsulation sheet 10 will now be described.

Figure 2A:
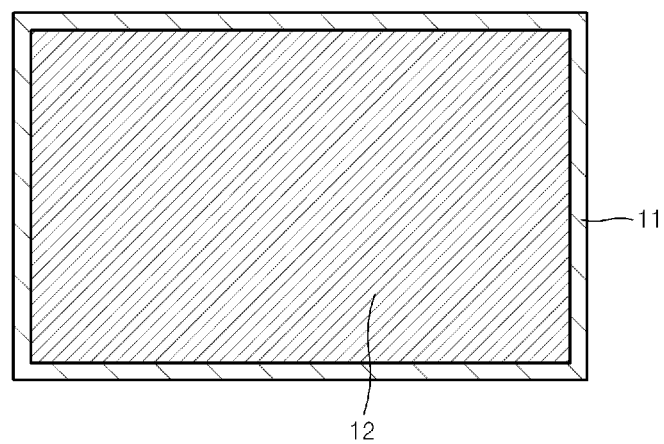
FIGS. 2A, 3A, 4A, and 5A are plan views showing a method of manufacturing the encapsulation sheet of FIG. 1, according to an embodiment.
Figure 2B:
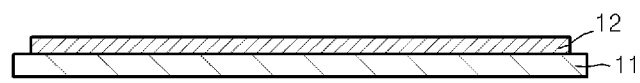
FIGS. 2B, 3B, 4B, and 5B are cross-sectional views showing a method of manufacturing the encapsulation sheet of FIG. 1, according to an embodiment.

First, referring to FIGS. 2A and 2B, the sealant 12 is formed on the second sheet 11. The sealant 12 may be formed of a thermal hardening material or an optical-hardening material, which is described below.

Figure 3A:
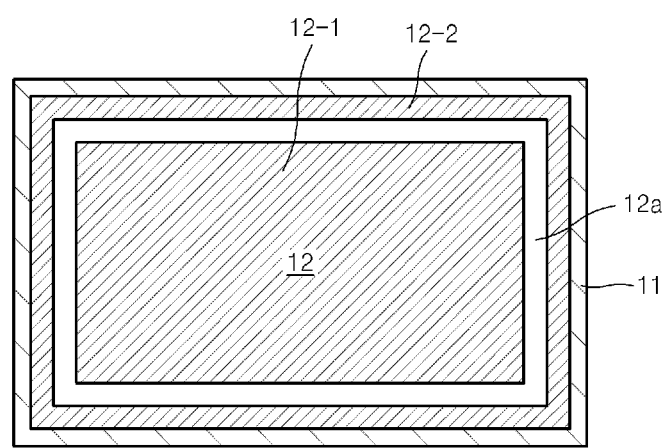
Figure 3B:
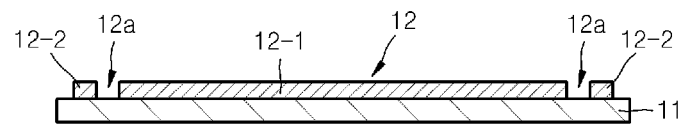

Next, referring to FIGS. 3A and 3B, a space 12a is formed between a first sealant portion 12-1, which is the center region, and a second sealant portion 12-2, which is an edge region. The space 12a matches with the shape of the getter 14 to be formed.

Figure 4A:
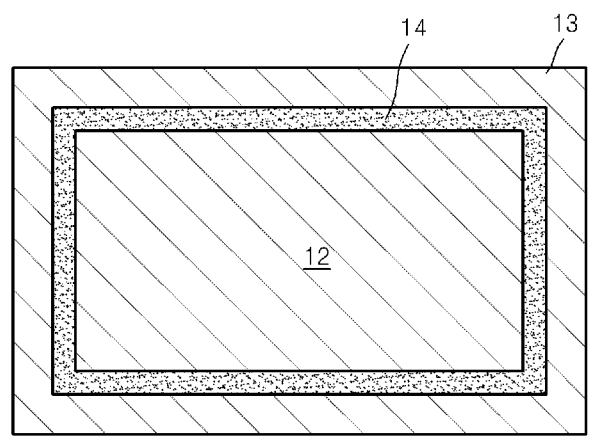
Figure 4B:

When the second sheet 11 on which the space 12a and the sealant 12 are formed is prepared, as shown in FIGS. 4A and 4B, the getter 14 is formed on the first sheet 13. The getter 14 is formed in a closed loop shape surrounding the display unit 21 (refer to FIG. 6C). The material of the getter 14 is described below.

The sequence of forming the getter 14 on the first sheet 13 and the forming of the sealant 12 on the second sheet 11 may be reversed.

Figure 5A:
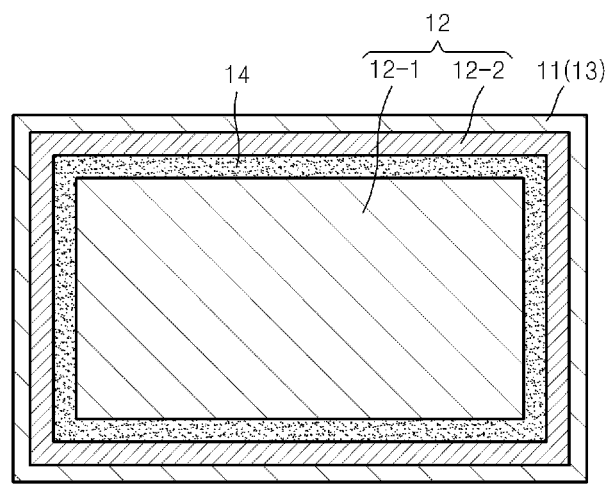
Figure 5B:
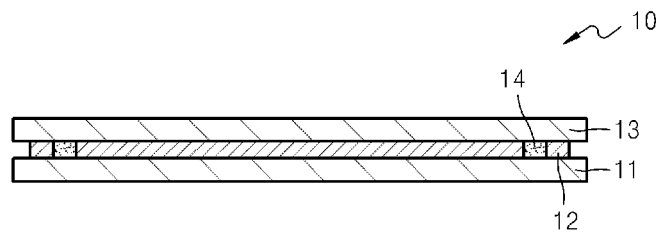

The first sheet 13 and the second sheet 11 prepared as described above are, as shown in FIGS. 5A and 5B, coupled as one-body. At this point, the getter 14 of the first sheet 13 enters into the space 12a in the sealant 12 of the second sheet 11.

In this way, the encapsulation sheet 10 to be mounted in a flat panel display device is manufactured.

Materials for forming the sealant 12 and the getter 14 are as follows.

The sealant 12 may be formed of a thermal hardening material or an optical hardening material.

The thermal hardening material may be a composite in which an epoxy resin, thermal hardening agent, a hardening promotion agent, a coupling agent, and an anti-oxidant are mixed.

The epoxy resin may be bisphenol A-type epoxy resin, bisphenol F-type epoxy resin, hydrogenated bisphenol type epoxy resin, alicyclic epoxy resin, aromatic epoxy resin, novolac type epoxy resin, or dicyclopentadiene type epoxy resin, and a compound having these epoxy groups may be used independently or by mixing at least two compounds.

The thermal hardening agent may be a polyamine group hardening agent such as diethylenetriamine, triethylenetetramine, N-amino-ethyl piperazine (AEP), diamino-diphenyl-methane, and adipic acid dihydrazide; a poly mercaptan group hardening agent such as phenol novolac type group hardening agent and trioxane trimethylene mercaptan; an acid anhydride group hardening agent such as benzyl-dimethylamine and 2,4,6-tris(dimethylaminomethyl) phenol; and an imidazole compound such as 2-methylimidazol, 2-ethyl-4-methylimidazol, and 1-benzyl-2-methylimidazol. Besides the above, a solid dispersion type latent curing hardening agent or a latent curing hardening agent sealed in micro capsules can also be used.

The hardening promotion agent may be quaternary ammonium salts, quaternary sulfonium salts, various metal salts, or tertiary amine salts. More specifically, the quaternary ammonium salt may include tetramethyl ammonium bromide and tetrabutyl ammonium bromide; the quaternary sulfonium salt may include tetraphenyl phosphonium bromide and tetrabutyl phosphonium bromide; the metal salt may include octyl acid zinc and octyl acid tin; the imidazol may include 1-benzyl-2-methyl imidazol, 1-benzyl-2-phenyl imidazol, and 2-ethyl-4-methyl imidazole; and the tertiary amine salt may include benzyl dimethyl amine.

The coupling agent may include a silane group coupling agent, a titanate group coupling agent, an aluminate group coupling agent, and a silicon compound. These materials may be independently used or as a composite in which at least two of these materials are mixed. If a coupling agent is included in the sealant 12, the adhesiveness of the resin composite is increased and the viscosity of the resin composite is reduced. The thermal hardening resin composite for sealing may include the coupling agent in a range from about 0.001 to about 5 wt %, and more preferably, from about 0.01 to about 1 wt % thereof.

The anti-oxidant prevents the hardening material from being degraded by oxidation when the hardening material is thermally hardened, and thus, further increases the thermal stability of the hardening material. The antioxidant may include a phenolic antioxidant, a sulfuric antioxidant, and a phosphoric antioxidant. More specifically, the phenolic antioxidant may be dibutyl hydroxy toluene (2-6-di-tetra-butyl-p-cresol) (BHT), the sulfuric antioxidant may be a mercaptopropionic acid derivative, and the phosphoric antioxidant may be triphenyl phosphate (9,10-dihydro-9-oxa-10-phospha phenanthrene-10-oxide) (HCA). These antioxidants may be independently used or a composite in which at least two of these materials are mixed may be used. The thermal hardening resin composite may include the antioxidant in a range from about 0.001 to about 5 wt %, and more preferably, from about 0.01 to about 0.5 wt %.

Next, if the sealant 12 is an optical hardening material, the sealant 12 may be a composite in which an epoxy resin, a photoinitiator, a mineral filler, a coupling agent, a spacer, a photoacid generator, and a radical initiator are mixed.

The epoxy resin may be an aromatic epoxy resin, alicyclic epoxy resin, or a mixture of these materials. The aromatic epoxy resin may be biphenyl epoxy resin, bisphenol A-type epoxy resin, bisphenol F-type epoxy resin, phenol novolac type epoxy resin, and dicyclopentadiene type epoxy resin, or a mixture of these materials.

The photoinitiator hardens the epoxy resin using light, and may be an aromatic diazonium salt, an aromatic sulfonium salt, an aromatic iodine aluminum salt, an aromatic sulfonium aluminum salt, and a metallocene compound. Specifically, the photoinitiator may be an aromatic sulfonium salt, and practical examples may be sulfonium hexafluoro phosphate compound and aromatic sulfonium hexafluoro antimonite compound.

The mineral filler may be a panel shape or a globular shape material, such as talc, silica, magnesium oxide, mica, montmorillonite, alumina, graphite, beryllium oxide, aluminum nitride, carbon silicate, mullite, and silicon, or a mineral filler that is formed by inducing a substituent to one of the above mineral fillers and has a diameter or a major axis in a range from about 0.1 to about 20 μm. After hardening the sealant 12, the mineral filler is uniformly distributed in the composite, and thus, reinforces the bonding force of the sealant 12 by dispersing stress being applied to the composite, and also, increases the characteristic of moisture penetration into the flat panel display device by effectively preventing the sealant 12 from moisture penetration.

The coupling agent may be a silane group coupling agent, a titanate group coupling agent, or a silicon compound, and these coupling agents may be used alone or in a mixed state.

The coupling agent may be a silane coupling agent in which alkoxysilane and diglycidyl ether are included in one molecule.

The spacer maintains the thickness of the flat panel display device, for example, a gap between the substrate 20 and a sealing substrate 30 at a predetermined distance after hardening. The thickness of the panel may be maintained at from about 5 to about 50 μm, and more preferably, from about 5 to about 25 μm. The spacer may have a globular shape or a log shape. However, the shape of the spacer is not specifically limited, for example, the spacer may have any shape as long as the spacer can maintain the thickness uniform.

The photoacid generator is not specifically limited as long as the photoacid generator can generate Lewis acid or Bronsted acid by being exposed to light, and may be a sulfide group compound such as an organic sulfonic acid or an onium group compound such as an onium salt. Specifically, the photoacid generator may be one selected from the group consisting of phthalimidotrifluoromethanesulfonate, dinitrobenzyl tosylate, n-decyldisulfone, naphthylimidotrifluoromethanesulfonate, diphenyl iodide hexafluorophosphate, diphenyl iodide hexafluoroarsenate, diphenyl iodide hexafluoroantimonate, diphenyl-p-methoxyphenylsulfonium triflate, diphenyl-p-toluenylsulfonium triflate, diphenyl-p-isobutylphenylsulfonium triflate, triphenylsulfonium hexafluoroarsenate, triphenylsulfonium hexafluoroantimonate, triphenylsulfonium triflate, and dibutylnaphthylsulfonium triflate.

The radical initiator may be a radical photopolymerization initiator that generates radicals by being decomposed by electromagnetic energy rays such as UV rays, or a thermal decomposable radical polymerization initiator that generates radicals by being decomposed by heat. The radical photopolymerization initiator may include type I alpha cleavage initiator and type II photoinitiator. The type I alpha cleavage initiator may be one selected from the group consisting of an acetophenone derivative such as 2-hydroxy-2-methylpropiophenon and 1-hydroxy cyclohexyl phenyl ketone; an acylphosphine oxide derivative such as bis(2,4,6-trimethylbenzoyl) phenylphosphine oxide; and a benzoin ether derivative such as benzoin methyl ether and benzoin ethyl ether. The type II photoinitiator may be a compound such as benzophenone, isopropylthioxanthone, anthraquinone, or various substituted derivatives of these compounds. A radical polymerization initiator that can be thermally decomposed may be a peroxide selected from the group consisting of 1,1,3,3-tetramethylbutylperoxy-2-ethyl-hexanoate, 1,1-bis(t-butylperoxy)cyclohexane, 1,1-bis(t-butylperoxy)cyclododecan, di-t-butylperoxyisophthalate, t-butylperoxybenzoate, dicumyl peroxide, t-butylcumyl peroxide, 2,5-dimethyl-2,5-di(t-butylperoxy) hexane, 2,5-dimethyl-2,5-di(t-butylperoxy)-3-hexine, and cumene hydroperoxide. The amount of the radical polymerization initiator is an effective amount, and is typically in a range from about 0.01 to about 20 wt % per 100 wt % of acrylate or metacrylate.

Next, the getter 14 may be any material that readily reacts with an active gas (including water and oxygen) and does not harm an apparatus. A desiccant that is a kind of getter material that removes moisture is useful in the current embodiment. The appropriate getter material may be a Group IIA metal and a metal oxide, for example, calcium metal, barium metal, calcium oxide, and barium oxide.

A method of manufacturing the encapsulation sheet 10 described above will now be described with reference to FIGS. 6A through 6C.

Figure 6A:
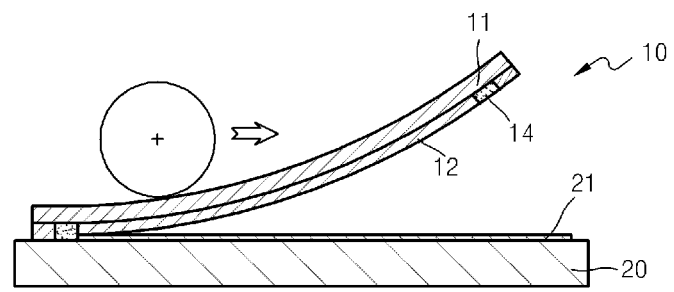
FIGS. 6A through 6C are cross-sectional views showing a method of manufacturing a flat panel display device using the encapsulation sheet of FIG. 1, according to an embodiment.

Referring to FIG. 6A, after preparing the substrate 20 on which the display unit 21 is formed and the encapsulation sheet 10, the first sheet 13 of the encapsulation sheet 10 is removed. Afterwards, the surface of the encapsulation sheet 10 from which the first sheet 13 is removed is attached to the substrate 20 by using a roller.

Figure 6B:
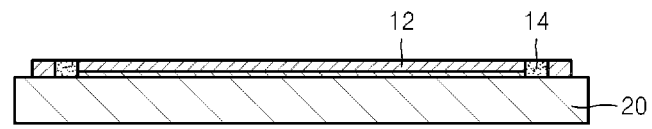

Next, referring to FIG. 6B, the second sheet 11 is also removed. Then, the resultant structure has a shape in which the sealant 12 and the getter surround the display unit 21.

Figure 6C:
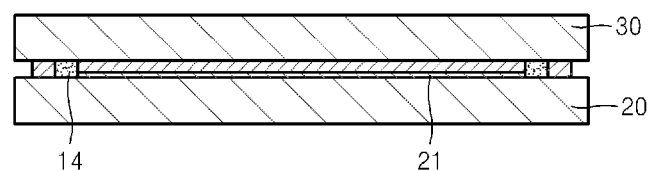

Referring to FIG. 6C, a sealing structure for the display unit 21 is completed by mounting the sealing substrate 30 on the encapsulation sheet 10.

In this way, a flat panel display device may be manufactured using the encapsulation sheet 10.

Thus, when a flat panel display device is manufactured using the encapsulation sheet 10 described above, the folded sealant 12 and the getter 14 are simultaneously mounted on the substrate 20, and thus, the process for manufacturing a flat panel display device can be simplified since a complicated conventional process of mounting the getter in a vacuum state is unnecessary, and outgassing can also be avoided.

While the present embodiments have been particularly shown and described with reference to example embodiments thereof, it will be understood by those of ordinary skill in the art that various changes in form and details may be made therein without departing from the spirit and scope of the present embodiments as defined by the following claims.

What is claimed is:

1. A flat panel display device comprising:
a substrate;
a display unit formed on the substrate;
an encapsulation sheet that covers the display unit; and
a sealing substrate formed on the encapsulation sheet,
wherein the encapsulation sheet comprises:
a getter that surrounds the display unit to absorb moisture; and
a sealant that fills a space between the substrate and the encapsulation sheet together with the getter for absorbing moisture.

2. The flat panel display device of claim 1, wherein the getter has a closed loop shape that surrounds the display unit.

3. The flat panel display device of claim 1, wherein the sealant comprises:
a first sealant portion formed in the center region of the second sheet that corresponds to the display unit; and
a second sealant portion formed in an edge region of the second sheet that corresponds to an edge region of the display unit,
wherein the space is located between the first and second sealant portions.

4. An encapsulation sheet comprising:
a first sheet on which a getter is formed; and
a second sheet on which a sealant having a space corresponding to the shape of the getter is formed,
wherein the first sheet and the second sheet are folded so that the getter enters into the space.

5. The encapsulation sheet of claim 4, wherein the getter has a closed loop shape.

6. A flat panel display device comprising the encapsulation sheet of claim 5.

7. The encapsulation sheet of claim 4, wherein the sealant comprises:
a first sealant portion formed in the center region of the second sheet; and
a second sealant portion formed in an edge region of the second sheet, wherein the space is located between the first and second sealant portions.

8. A flat panel display device comprising the encapsulation sheet of claim 7.

9. A flat panel display device comprising the encapsulation sheet of claim 4.

10. A method of manufacturing a flat panel display device, the method comprising:
    providing a substrate;
    forming a display unit on the substrate;
    forming a getter on a first sheet;
    forming a sealant having a space corresponding to the shape of the getter on a second sheet;
    forming an encapsulation sheet by folding the first sheet and the second sheet so the getter enters into the space; and
    attaching the encapsulation sheet to the substrate.

11. The method of claim 10, wherein the attaching of the encapsulation sheet on the substrate comprises:
    removing one of the first sheet and the second sheet of the encapsulation sheet;
    attaching the surface of the encapsulation sheet, from which one of the first sheet and the second sheet is removed, to the substrate; and
    removing the remaining one of the first sheet and the second sheet of the encapsulation sheet.

12. The method of claim 10, further comprising forming a sealing substrate on the encapsulation sheet.

13. A flat panel display device manufactured by the method of claim 12.

14. The method of claim 10, wherein the getter has a closed loop shape that surrounds the display unit.

15. A flat panel display device manufactured by the method of claim 14.

16. The method of claim 10, wherein the sealant comprises:
    a first sealant portion formed in the center region of the second sheet that corresponds to the display unit; and
    a second sealant portion formed in an edge region of the second sheet that corresponds to an edge region of the display unit,
    wherein the space is located between the first and second sealant portions.

17. A flat panel display device manufactured by the method of claim 16.

18. A flat panel display device manufactured by the method of claim 10.

19. A flat panel display device manufactured by the method of claim 11.

* * * * *